United States Patent
Parangi (10) Patent No.: US 10,814,558 B2
(45) Date of Patent: Oct. 27, 2020

(54) SYSTEM AND METHOD FOR MINIMIZING DEVIATIONS IN 3D PRINTED AND SINTERED PARTS

(71) Applicant: MARKFORGED, INC., Watertown, MA (US)

(72) Inventor: Abraham Lawrence Parangi, Lincoln, MA (US)

(73) Assignee: MARKFORGED, INC., Watertown, MA (US)

(*) Notice: Subject to any disclaimer, the term of this patent is extended or adjusted under 35 U.S.C. 154(b) by 6 days.

(21) Appl. No.: 16/394,516

(22) Filed: Apr. 25, 2019

(65) Prior Publication Data
US 2019/0329499 A1 Oct. 31, 2019

Related U.S. Application Data

(60) Provisional application No. 62/662,871, filed on Apr. 26, 2018.

(51) Int. Cl.
*B29C 64/393* (2017.01)
*B33Y 50/02* (2015.01)
(Continued)

(52) U.S. Cl.
CPC .......... *B29C 64/393* (2017.08); *B29C 64/153* (2017.08); *B33Y 10/00* (2014.12); *B33Y 50/02* (2014.12)

(58) Field of Classification Search
CPC ............. B22F 2003/1057; B22F 3/008; B29C 64/153; B29C 64/386; B29C 64/393;
(Continued)

(56) References Cited

U.S. PATENT DOCUMENTS

2005/0154481 A1 7/2005 Berger et al.
2011/0074779 A1 3/2011 Voth
(Continued)

FOREIGN PATENT DOCUMENTS

CN 102472612 A 5/2012
WO 2017147412 A1 8/2017

OTHER PUBLICATIONS

Nysjö, Fredrik et al. "Using anti-aliased signed distance fields for generating surgical guides and plates from CT images;" Journal of WSCG. 2017; vol. 25, No. 1; pp. 11-20. (Year: 2017).*
(Continued)

*Primary Examiner* — Chad G Erdman
(74) *Attorney, Agent, or Firm* — Lando & Anastasi, LLP (57) ABSTRACT

According to various aspects and embodiments described herein, a method for optimizing a three-dimensional (3D) printing process comprises receiving 3D data characterizing a target 3D part, generating a 3D part mesh based on the received 3D data, generating a Signed Distance Field (SDF) based on the 3D part mesh, performing a predictive analysis using the SDF to generate a predicted error field, calculating a correction field based on the predicted error field, applying the correction field to the 3D part mesh to produce a corrected 3D part mesh, creating a corrected 3D print profile using the corrected 3D part mesh, outputting the corrected 3D print profile to a 3D printing device, and printing a corrected 3D part using the 3D printing device and the corrected 3D print profile.

20 Claims, 8 Drawing Sheets

(51) Int. Cl.
*B33Y 10/00* (2015.01)
*B29C 64/153* (2017.01)

(58) Field of Classification Search
CPC ......... B33Y 10/00; B33Y 50/00; B33Y 50/02;
G06F 30/20
See application file for complete search history.

(56) References Cited

U.S. PATENT DOCUMENTS

| | | | |
|---|---|---|---|
| 2014/0172377 A1* | 6/2014 | Taubin | G06T 17/00 |
| | | | 703/1 |
| 2017/0015057 A1* | 1/2017 | Stevens | B29C 64/386 |
| 2018/0154438 A1 | 6/2018 | Mark | |
| 2020/0142384 A1* | 5/2020 | Bressler | B33Y 50/00 |

OTHER PUBLICATIONS

Notification of Transmittal of the International Search Report and the Written Opinion of the International Searching Authority from corresponding PCT/US2019/029113 dated Sep. 11, 2019.

* cited by examiner

SYSTEM AND METHOD FOR MINIMIZING DEVIATIONS IN 3D PRINTED AND SINTERED PARTS

CROSS-REFERENCE TO RELATED APPLICATIONS

This application claims priority under 35 U.S.C. § 119(e) to U.S. Provisional Application Ser. No. 62/662,871 titled "SYSTEM AND METHOD FOR MINIMIZING DEVIATIONS IN 3D PRINTED AND SINTERED PARTS," filed on Apr. 26, 2018, which is hereby incorporated by reference in its entirety.

FIELD

Aspects relate to managing and minimizing deviations in three-dimensional (3D) printed parts.

SUMMARY

At least one aspect of the invention is directed to a method for optimizing a three-dimensional (3D) printing process comprising receiving 3D data characterizing a target 3D part, generating a 3D part mesh based on the received 3D data, generating a Signed Distance Field (SDF) based on the 3D part mesh, performing a predictive analysis using the SDF to generate a predicted error field, calculating a correction field based on the predicted error field, applying the correction field to the 3D part mesh to produce a corrected 3D part mesh, creating a corrected 3D print profile using the corrected 3D part mesh, outputting the corrected 3D print profile to a 3D printing device, and printing a corrected 3D part using the 3D printing device and the corrected 3D print profile.

In one example, calculating the correction field includes executing a transformation function. In an example, the method includes executing, with respect to a second 3D part mesh based on second 3D data characterizing a second target 3D part, an iterative process including creating a 3D print profile using the second 3D part mesh, outputting the 3D print profile to the 3D printing device, printing a 3D part using the 3D printing device and the 3D print profile, scanning the 3D part to generate a measured point-set, and performing at least one regression analysis on the measured point-set.

In an example, the method includes determining a coarse fit between the second 3D data and the second 3D part mesh, determining, based on the coarse fit, a fine fit between the second 3D data and the second 3D part mesh, and outputting, based on the coarse fit and the fine fit, an iterative error field. In one example, determining the coarse fit includes executing a least squares regression analysis on the second 3D data and the second 3D part mesh to generate a seed value. In some examples, determining the fine fit includes executing a patchwise least squares analysis on the seed value.

In at least one example, the 3D print profile includes a plurality of scan points, wherein generating the iterative error field includes dividing each scan point of the plurality of scan points into a second plurality of scan points, and wherein a third plurality of scan points includes each respective second plurality of scan points. In an example, the method includes executing a fine fit analysis on the third plurality of scan points, and outputting, based on the fine fit analysis, the iterative error field.

In an example, the predictive analysis comprises computing a distance field of the 3D part mesh over a 3D voxel grid to generate a 3D matrix of SDF values, and processing the 3D matrix of SDF values using a neural network, wherein the neural network comprises a plurality of subnetworks arranged in a sequence from highest to lowest and processing comprises processing the 3D matrix of SDF values through each of the subnetworks in the sequence, and each subnetwork is configured to receive a preceding output representation generated by a preceding subnetwork in the sequence. In one example, the method includes training the neural network on a training data set obtained from printed and scanned 3D parts, the training data set including the iterative error field.

According to an aspect of the disclosure, a non-transitory computer-readable medium storing sequences of computer-executable instructions for optimizing a three-dimensional (3D) printing process is provided, the sequences of computer-executable instructions including instructions that instruct at least one processor to receive 3D data characterizing a target 3D part, generate a 3D part mesh based on the received 3D data, generate a Signed Distance Field (SDF) based on the 3D part mesh, perform a predictive analysis using the SDF to generate a predicted error field, calculate a correction field based on the predicted error field, apply the correction field to the 3D part mesh to produce a corrected 3D part mesh, create a corrected 3D print profile using the corrected 3D part mesh, output the corrected 3D print profile to a 3D printing device, and print a corrected 3D part using the 3D printing device and the corrected 3D print profile.

In one example, in instructing the at least one processor to calculate the correction field, the sequences of computer-executable instructions instruct the at least one processor to execute a transformation function. In an example, the sequences of computer-executable instructions further instruct the at least one processor to execute, with respect to a second 3D part mesh based on second 3D data characterizing a second target 3D part, an iterative process, and wherein, in instructing the at least one processor to perform the iterative process, the sequences of computer-executable instructions instruct the at least one processor to create a 3D print profile using the second 3D part mesh, output the 3D print profile to the 3D printing device, print a 3D part using the 3D printing device and the 3D print profile, scan the 3D part to generate a measured point-set, and perform at least one regression analysis on the measured point-set.

In an example, the sequences of computer-executable instructions instruct the at least one processor to determine a coarse fit between the second 3D data and the second 3D part mesh, determine, based on the coarse fit, a fine fit between the second 3D data and the second 3D part mesh, and output, based on the coarse fit and the fine fit, an iterative error field. In some examples, in instructing the at least one processor to determine the coarse fit, the sequences of computer-executable instructions instruct the at least one processor to execute a least squares regression analysis on the 3D data and the 3D part mesh to generate a seed value.

In one example, in instructing the at least one processor to determine the fine fit, the sequences of computer-executable instructions instruct the at least one processor to execute a patchwise least squares analysis on the seed value. In examples, the 3D print profile includes a plurality of scan points, wherein, in instructing the at least one processor to generate the iterative error field, the sequences of computer-executable instructions instruct the at least one processor to divide each scan point of the plurality of scan points into a second plurality of scan points, and wherein a third plurality of scan points includes each respective second plurality of scan points. In one example, the sequences of computer-executable instructions further include instructions that instruct at least one processor to execute a fine fit analysis on the third plurality of scan points, and output, based on the fine fit analysis, the iterative error field.

In at least one example, in instructing the at least one processor to perform the predictive process, the sequences of computer-executable instructions instruct the at least one processor to compute a distance field of the 3D part mesh over a 3D voxel grid to generate a 3D matrix of SDF values, and process the 3D matrix of SDF values using a neural network, wherein the neural network comprises a plurality of subnetworks arranged in a sequence from highest to lowest and processing comprises processing the 3D matrix of SDF values through each of the subnetworks in the sequence, and each subnetwork is configured to receive a preceding output representation generated by a preceding subnetwork in the sequence. In an example, the sequences of computer-executable instructions further include instructions that instruct at least one processor to train the neural network on a training data set obtained from printed and scanned 3D parts, the training data set including the iterative error field.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Additive manufacturing, or 3D printing, refers to a class of technologies for the direct fabrication of physical products from a 3D computer model by a layered manufacturing process. In contrast to material removal processes in traditional machining, the 3D printing process adds material layer by layer to construct products. This process can enable the direct printing of products with extremely complex geometry.

In a fused deposition additive manufacturing system, a 3D part or model may be printed from a digital representation of the 3D part in a layer-by-layer manner by extruding a flowable part material along toolpaths. The part material is extruded through an extrusion tip carried by a print head of a 3D printing device or system and is deposited as a sequence of roads on a substrate in a build plane. The extruded part material fuses to previously deposited part material and is then solidified. The position of the print head relative to the substrate is then incremented along one or more print axes, and the process can then be repeated to form a 3D part resembling the digital representation.

Some 3D printers are used to produce runs of identical parts in the tens, hundreds, or thousands. Uniformity between the parts is desired, where printed structures each have identical geometries that also match the geometrical dimensions set out in the computer program model.

Minimizing offsets between parts can be complicated by a manufacturing process that includes operations that can affect the surface characterization of the printed part. Various types of 3D printing utilize thermal and/or pressurized post-processing processes that affect the surface geometries. For example, in a "towpreg" process, continuous fiber reinforced materials that include a resin are deposited in a "green state." The part is subsequently placed under vacuum and heated to remove entrapped air voids present in the deposited materials and fully cure the part. In another example, and as described in U.S. patent application Ser. No. 15/862,156, which is herein incorporated by reference in its entirety, a "green body" may be formed from a 3D printing material that includes one or more binders and a powdered or spherized metal or ceramic sintering material that is additively deposited in successive layers. The binder material is then removed from the green body (for example, using a solvent, catalysis, pyrolysis) to form a "brown body." The brown body is then sintered at high temperature and/or pressure in a sintering oven. When the brown body is sintered at high temperature and/or pressure, remaining or second stage binder may pyrolyse away and the brown body contracts as it sinters. Application of heat (and optionally) pressure can eliminate internal pores, voids and microporosity between and within the metal or ceramic beads of the sintering material through at least diffusion bonding and/or atomic diffusion. The sintering phase of this process can often lead to the deviations described above between the geometries or surface characterization of the produced part and the desired geometries set out in the computer program model. Other sources of non-uniformities can be caused by deformation under gravity, asymmetric sintering caused by asymmetric heat transfer, and resistance to the "sintering force" (i.e., energy minimization of the printing material at critical sintering temperatures). The printing phase also introduces a certain level of non-uniformity, especially deformities caused by cooling (i.e., thermal contraction) after deposition.

Figure 1:
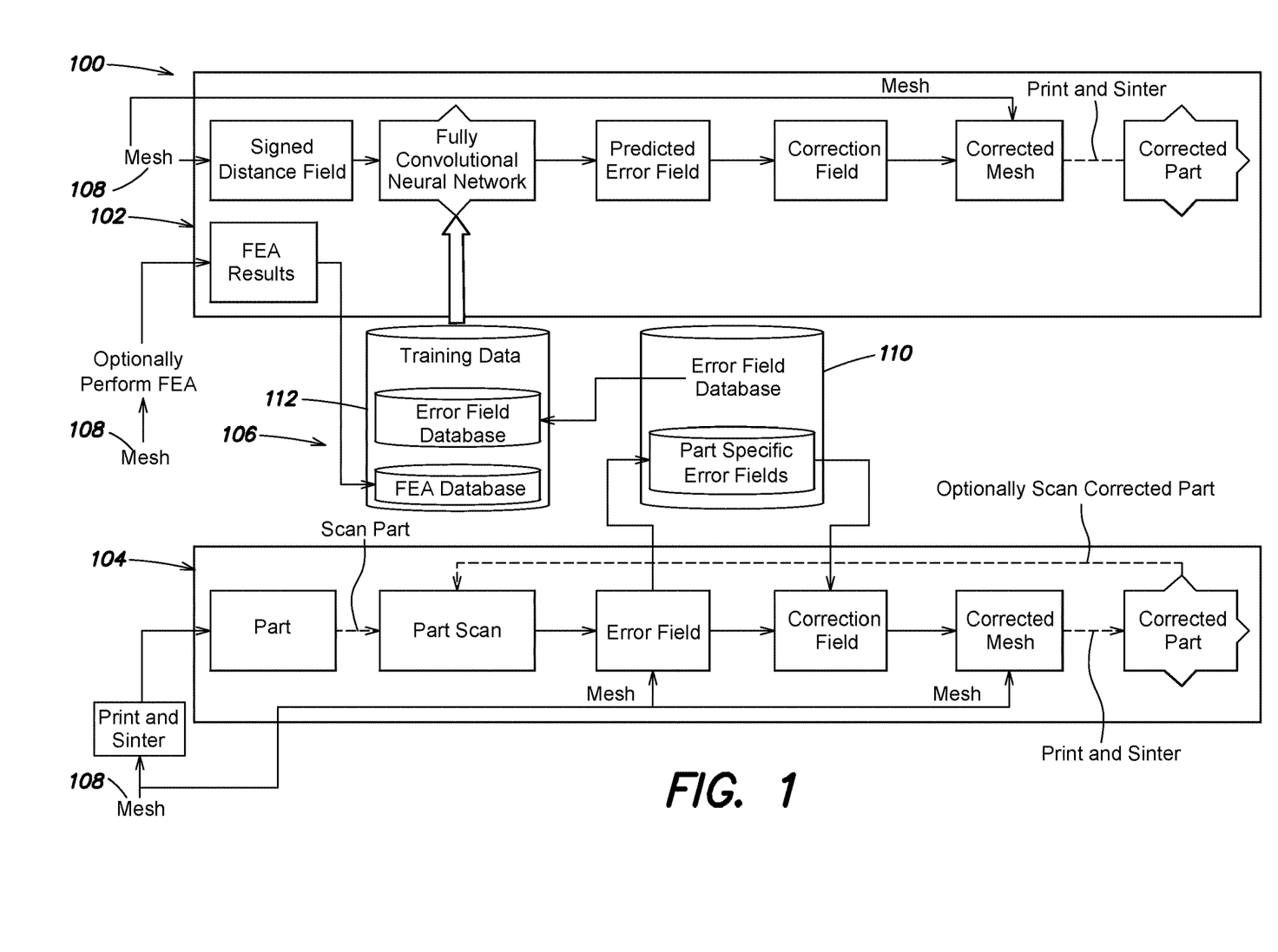
FIG. 1 is a block flow diagram of a system overview of methods according to aspects of the invention.

Two approaches or workflows are described below that manage and minimize deviations in 3D printed and bulk-sintered parts. FIG. 1 illustrates a system overview 100 including an iterative process 102 and a predictive process 104. The iterative process 102 utilizes a laser scanning system or other measurement system in combination with a produced part to perform the process. In contrast, the predictive process 104 does not require a scanning or measurement system for performing the process. A data block or module 106 is also shown in FIG. 1. The data block or module 106 stores various types of data, including error field data stored in an error field database 110 and training data stored in a training data database 112, which is utilized by each process 102, 104.

Each process 102, 104 illustrated in FIG. 1 is initiated by a 3D computer program model, such as a 3D CAD model, generated by a user. The 3D computer program model (also referred to herein as a digital solid model) includes the "target" dimensions of the desired part, such as target x, y, and z data points. This information can be used to create a surface mesh 108 (also referred to herein as "mesh," "part mesh," or "ideal part mesh"), which may be provided to the processes 102, 104. A surface mesh 108 can describe planar boundaries of the digital solid model of the desired part and can include interconnected triangles or other polygons. For example, the desired part's surface topography can be represented as a polygonal model (for example, polygon mesh) that includes elements corresponding to vertices, edges, faces, polygons, and surfaces. The part's corresponding surface mesh 108 can be sliced into a plurality of layers, and one or more printer deposition paths can be generated for each layer.

Iterative Process

Figure 1A:
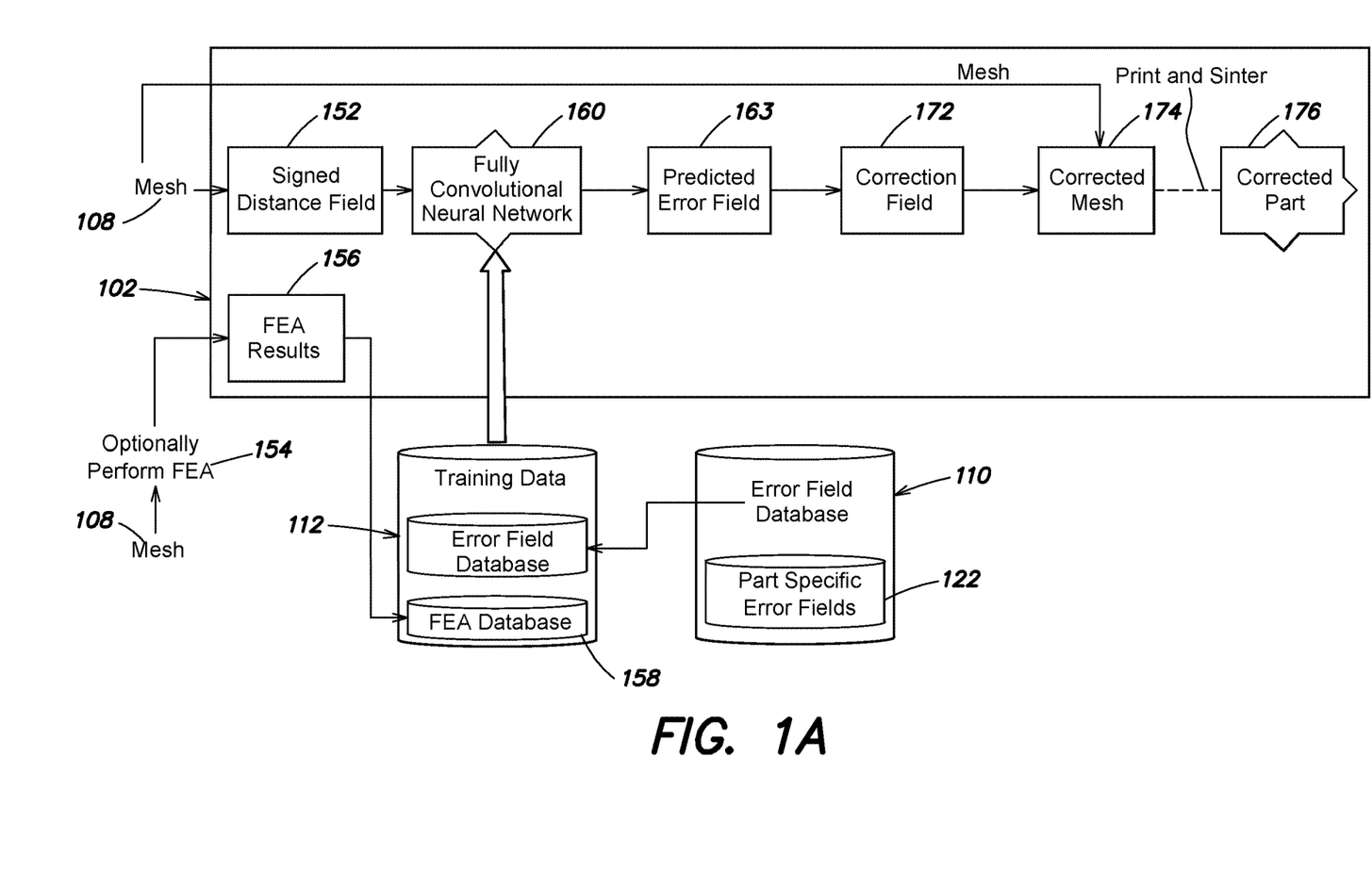
FIG. 1A is a block flow diagram of an example of a predictive process according to aspects of the invention.
Figure 1B:
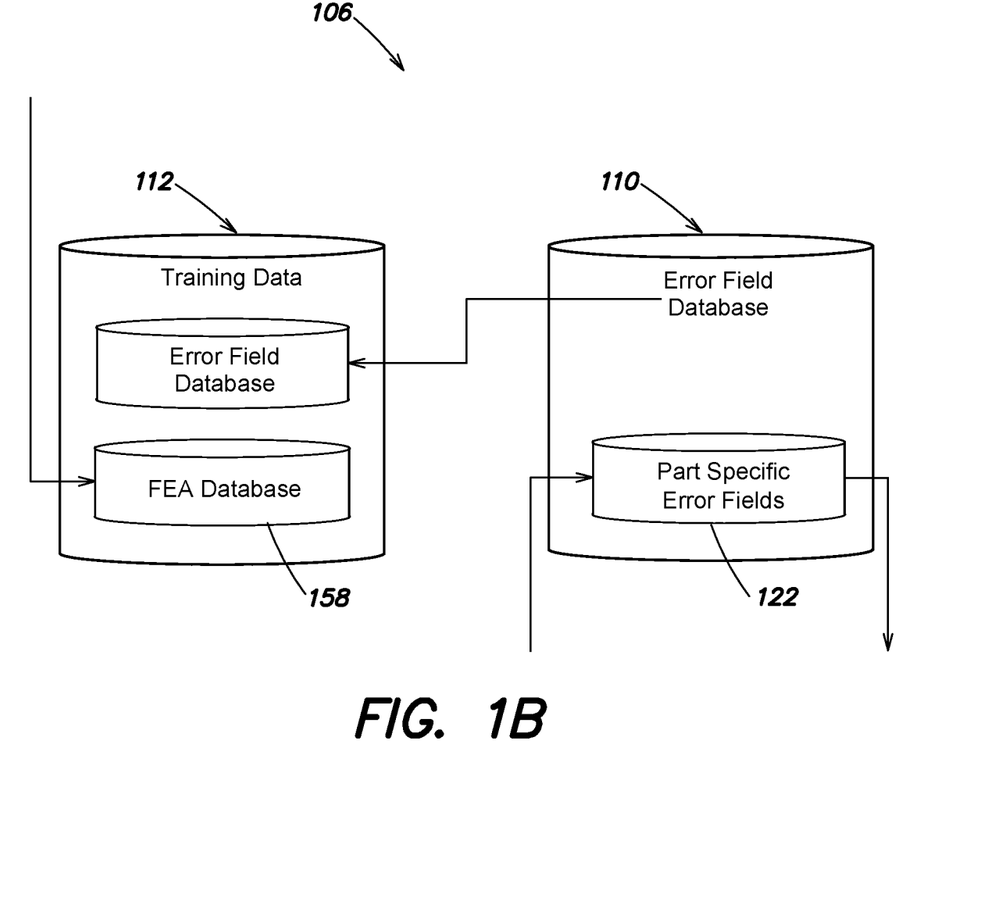
FIG. 1B is a block flow diagram of an example of a data block according to aspects of the invention.
Figure 1C:
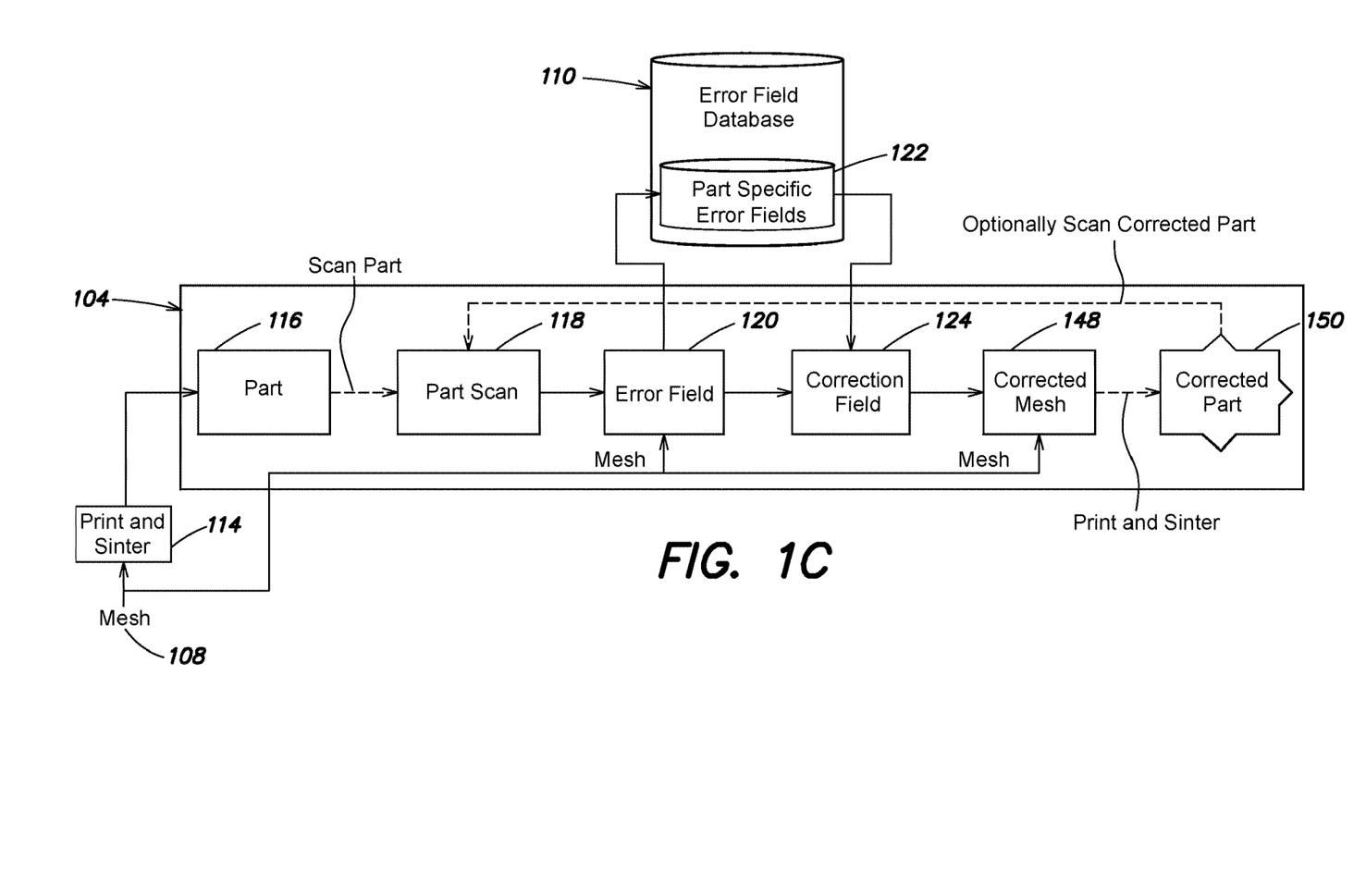
FIG. 1C is a block flow diagram of an example of an iterative process according to aspects of the invention.
Figure 2:
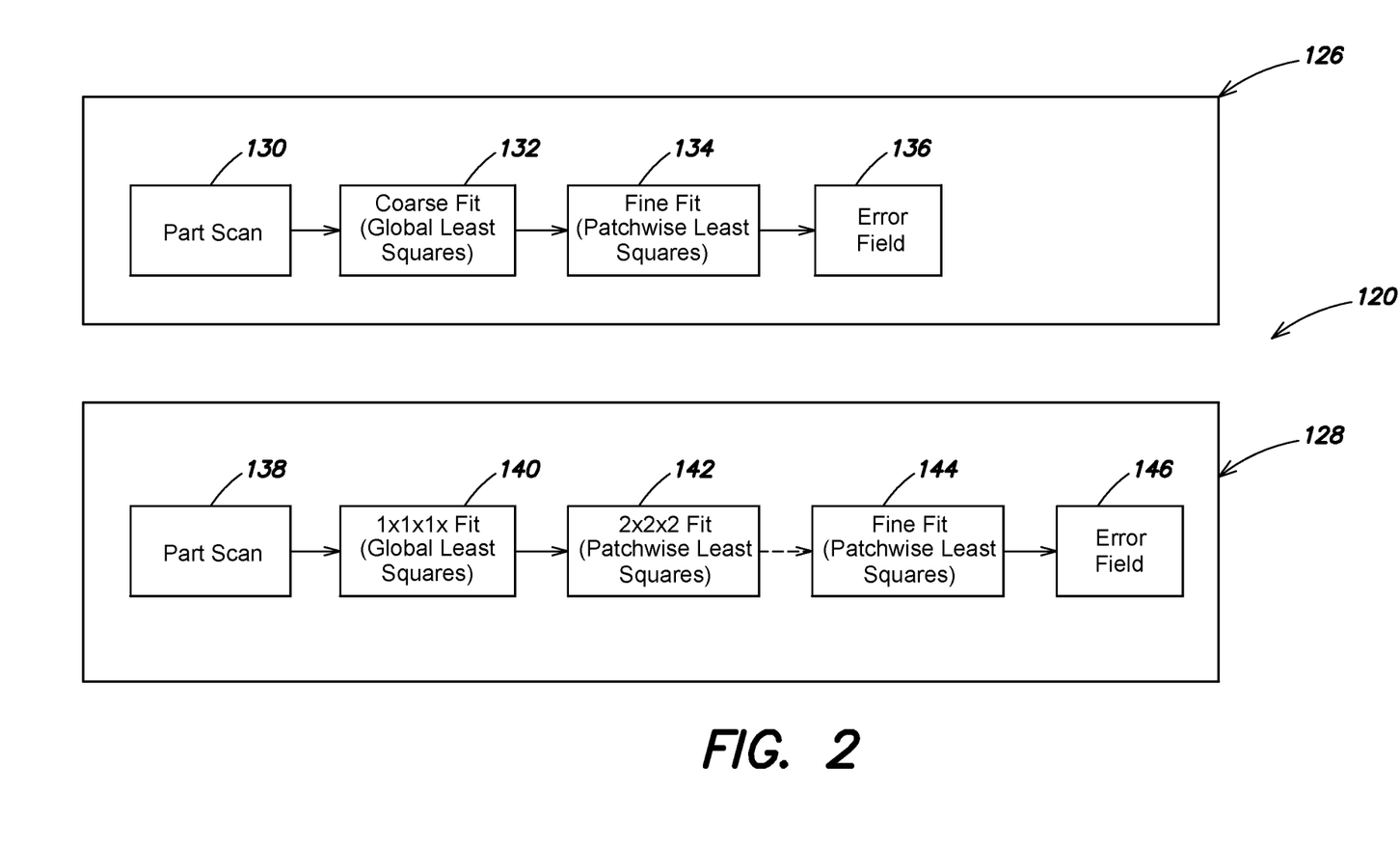
FIG. 2 is a block flow diagram of two example methods for computing an error field according to aspects of the invention.

An enlarged version of the iterative process 104 shown in FIG. 1 is shown in FIG. 1C. Once the mesh 108 and deposition paths for the 3D printer are generated, the part is printed and then sintered at act 114. At act 116 of the process 104, the process 104 is initiated with respect to the printed part. At act 118, the printed part is scanned using a laser scanning system or other measurement system to capture the part's shape (i.e., geometrical data). The part scan can be used to generate a 3D grid or mesh corresponding to the surface topography of the printed part. More specifically, this process generates a printed part mesh, otherwise referred to herein as a "measured point-set," which is compared against the ideal part mesh 108 associated with the computer program model. A field (i.e., an error field) representing the errors or deviations from the ideal part mesh 108 is computed at act 120 and used to generate part-specific error fields, which can be stored in a part-specific error field database 122 of the error field database 110. The part-specific error fields may be utilized by the process 104 at act 124 to generate a correction field. Two methods for executing act 120 are described below and are shown in FIG. 2. For example, the act 120 may include one or both of a two-step or two-level process 126, and a pyramidal process 128. Both of these methods implement regression analysis.

Two-Step Error Field Calculation

An example of a two-step error field calculation 126, as illustrated in FIG. 2, will now be described. Part scan data, which may be generated at act 118 shown in FIG. 1C, is received at act 130. At act 132, an initial "coarse" regression analysis is performed. For example, the coarse regression analysis may include a global least square regression analysis executed on the data to be compared, which may include the part scan data and the surface mesh 108. This initial regression analysis generates a coarse fit (for example, model) between the data sets. For example, the least square regression analysis can be used to compute a "coarse" least squares fit between the measured point-set and the ideal part mesh 108. This coarse fit provides a global solution that can then be used as input and functions to "seed" the second "fine" fit analysis discussed in further detail below.

According to one embodiment, the computational time to perform the coarse fitting analysis can be reduced by sub-sampling the measured point-set into a representative subset. The representative subset can be generated by randomly selecting points in the original measured point-set, where each selected point is at least at a predetermined distance from all points in the subset. For instance, a point in the measured point-set may be randomly selected and then additional points from the measured point-set that maximize the distance to any point already in the subset are then iteratively added to the subset.

In some instances, the single coarse fit is inadequate to approximate complex non-linear transforms, as is the case in typical 3D printing characterizations. Local transforms may therefore be derived or otherwise applied where the regression parameters vary as a function of the input data point. At act 134, a second, "fine" (or "local") fit regression analysis is executed.

According to some embodiments, the fine fit regression analysis may be based on a patchwise least squares approximation to compute a "fine" least squares fit. For instance, the measured point-set may be divided into a plurality of point-set patches. Using the coarse fit global solution as a source of input, the fine fit regression fits each patch to the part. Thus, patchwise least squares analysis may be used to perform patchwise surface fitting to compute the fine least squares fit.

According to at least one embodiment, computational time for performing the fitting analysis can be reduced by calculating representative subsets for each point-set patch. The representative subsets may be computed using a similar method as described above.

In some embodiments, the patchwise least squares regression analysis fits each point-set patch based on an optimization analysis that accounts for both the local fit to the part model (i.e., the deviation between a measured point-set value and the corresponding ideal part mesh value) as well as the continuity of fit from patch-to-patch. For example, an additional cost function may be incorporated into the fine fit optimization process that is proportional to the magnitude of the local transforms. This functions to prevent the local fit optimization from fitting some region of the measured point-set to a distant region of the part. At act 136, an error field calculation is output responsive to execution of act 134. As discussed above, the error field may be provided to the part-specific error field database 122.

Pyramidal Error Field Calculation

An example of the pyramidal error field calculation 128, as illustrated in FIG. 2, will now be described. The pyramidal error field calculation 128 comprises performing a 3D axis-aligned spatial subdivision process. This process involves performing a series of successive regressions using different levels of patch analysis by progressively subdividing each patch of a base patch into more detailed units. According to at least one embodiment, the units are octants and the 3D part takes on an octree framework. A new local transform is computed for each child octant, which builds upon the parent transforms.

Part scan data, which may be generated at act 118 of FIG. 1C, is received at act 138. At act 140, a global least squares analysis is executed. Scan points upon which the global least squares analysis is executed are in the first level regression (i.e., 1×1×1 level). At act 142, a patchwise least squares analysis is executed. In executing the patchwise least squares analysis, a 2×2×2 subdivision is generated from the first level regression, such that the first level cell is divided into eight cells (octants) in the second level. The process of dividing each of the cells into eight octants is repeated at each subsequent level such that an octant in the previous level is divided on each axis into eight new octants. The subdivision is terminated when no further division is possible or if no further division is necessary (for example, a predetermined optimization value or other target value has been reached). The scan points associated with each octant are considered one at a time. At act 144, a fine fit analysis process is executed in a manner similar to the process discussed above with respect to act 134 on the scan points. At act 146, an error field calculation is output responsive to execution of act 144. As discussed above, the error field may be provided to the part-specific error field database 122.

Returning to FIG. 1C, once the error field calculation has been performed at act 120, the resulting data is stored in the error field database 122. As discussed in greater detail below, the resulting error field data stored in the error field database 122 may be provided to the predictive process 102 as training data. The data may be used to calculate a correction field at act 124. The correction field can then be used to modify the part mesh 108 associated with the computer program model. The correction field may thus represent modifications to the part geometry that can be added in order to counteract the deviations of the printing and sintering process.

According to one embodiment, examples of act 124 may include using a transformation function. For example, a transform t may represent the action of the printing and sintering process on the part such that $t(M_{ideal})=M_{actual}$, where $M_{ideal}$ is the surface of the part mesh and $M_{actual}$ is the measured surface of the printed and sintered part (i.e., the measured point-set). The calculated error field using the two-level or pyramidal method described above with respect to act 128 approximates the transform $t^{-1}$ where $t^{-1}(M_{actual})=M_{ideal}$. For the correction field, a transform c can be calculated such that $t(c(M_{ideal}))=M_{ideal}$, and the transform c can be defined according to $c=g(t^{-1})$, where g is a smoothing filter applied for damping purposes.

At act 148, the correction field can be applied to the part mesh 108 to modify and update the part mesh as a corrected part mesh, also referred to herein as a "corrected mesh." The correction field may be applied to the part mesh 108 by subdividing the part mesh 108 into more detailed meshes and then advecting the vertices of the part mesh along the correction field. The subdivision is to a degree of detail such that the vertices corresponding to each edge of the polygon shapes lie in either the same or adjacent cells of the correction field. Error fields with a desired higher degree of resolution thus require greater (i.e., finer) subdivision of the part mesh. The corrected part mesh can be generated by sampling each vertex within the grid space (correction field) using a trilinear interpolation method that functions to linearly interpolate points within a volumetric dataset.

At act 150, the corrected part mesh may be used to produce a printed part that may be sintered to create a corrected part. The process 104 may return to act 118, at which the corrected part may be scanned and compared against the surface mesh 108 to determine if the corrected part matches or otherwise complies with predetermined target criteria. If not, the process may be iteratively repeated as shown in FIG. 1C, to generate an updated corrected mesh until a corrected part complies with the predetermined target criteria. The iterative process thereby uses the new scan information as well as the previous correction calculations by modifying the previous iteration's corrected mesh.

Predictive Process

In sintering metal and ceramic powder printed (compact) parts, the powder particles can weld together under the action of surface tension and shrinkage of the powder printed object. During sintering particulate material is converted into polycrystal. In the initial stage, cohesive bonds (necks) are formed between grains, and as the sintering process continues, the necks between particles grow. Grain rearrangement and increases in grain compaction also can occur. As grain growth advances, porosity can be reduced and potentially substantially eliminated. Reduction of total surface energy of the system is typically the main driving force of sintering. As a result of stresses in the neck and surface tension, the powder particles are attracted to each other, which leads to shrinkage of the printed part.

Non-uniform shrinkage during sintering can cause shape changes in sintered parts. The predictive process 102 described herein is one example of a method that can be used to predict the shrinkage behavior of the printed part during the sintering process.

An enlarged version of the predictive process 102 of FIG. 1 is shown in FIG. 1A. Unlike the iterative process described above, the predictive workflow utilizes a computational approach that does not require scanning or measurement by the user. The process involves performing a series of operations for purposes of generating a predicted error field that represents the error that the part would be expected to have.

As noted above, the part's surface topography can be represented as a polygonal model, or mesh 108, where the transition from the 3D object to open space describes a boundary representation or mesh boundary. Distance fields can overcome several problems typically associated with boundary representations.

According to some embodiments, the predictive process 102 may be initiated upon receipt of the mesh 108. At act 152, a distance field process is executed. Distance field processes may include storing a distance between each voxel in a voxel grid and a nearest surface in a volume texture. The signed distance field value is the length of the shortest vector between the voxel and the part's mesh boundaries, where the vector is not limited to being in any one plane, axis, or direction. As such, the signed distance field is a scalar field. As indicated in FIG. 1A, the process 102 begins at act 152 by computing the Signed Distance Field (SDF) of the part mesh 108 over a voxel grid of a fixed size. For example, an SDF field can be generated by dividing a 3D build space or build volume, which contains the part mesh 108, into a 3D matrix of voxels. The closest distance from each voxel to a part mesh boundary is then determined such that if the voxel is within the part, the distance is set as a positive value, if the voxel is outside of the part, the distance is set as a negative value, and if the voxel is on the part boundary, the distance is zero. This produces a 3D matrix of signed distance field values.

According to some embodiments, a numerical simulation, such as Finite Element Analysis (FEA), is performed at act 154 as part of the predictive process 102. For example, a finite element simulation of the sintering process may be executed on the mesh 108 to create hypothetical structural response data. This approach thus implements an incremental finite element simulation of the sintering process and its effect (i.e., change in apparent volume) on the printed part.

The FEA simulates sintering by including the shrinkage strain-rate due to the sintering in the formulation. A three-dimensional thermomechanical/structural process is performed on a finite element mesh to calculate the structural response data. The part mesh 108, which represents the mathematical model of the 3D part, is subdivided into non-overlapping components of simple geometry that constitute the finite element. The response of each finite element is expressed in terms of a finite number of degrees of freedom characterized as the value of an unknown set of functions at a set of nodal points. The response of the mathematical model is then considered to be approximated by that of the discrete model obtained by connecting or otherwise assembling the collection of all the finite elements.

Equilibrium or conservation equations that govern the boundary value problem include or otherwise account for temperature, density, and stress distribution during the sintering process. According to some embodiments, these equations account for thermal equilibrium during heating (sintering) and heat transfer asymmetry (i.e., asymmetrical sintering rates and durations). For instance, heat transfer through the part defines the rates and durations of the sintering.

Inputs to the FEA model also include material properties, such as the Thermal Expansion Coefficient, Young's Modulus, layer densification rates, and creep.

At act 156, FEA results are generated responsive to execution of act 154. The results from the execution of act 154 can be used for one or more purposes. According to some embodiments, the hypothetical structural response data may be stored in an FEA database 158 within the training data database 112. Data stored in the FEA database 158 may be used to augment training data to teach a neural network-based model, as indicated in FIG. 1A and as discussed in further detail below.

In alternative embodiments, FEA may also be used for purposes of generating a simulated error field. A simulated error field may be extracted from the hypothetical structural response data. This simulated error field may then be used as an input to the neural network (described below).

Although the examples discussed above use FEA as the numerical simulation, other numerical methods are also within the scope of this disclosure and include any numerical method that is capable of producing a deformation prediction.

Returning to FIG. 1A, at act 160, the SDF generated at act 152 is used as input to a machine learning algorithm such as a multilayer neural network for purposes of determining the predicted error field. In some embodiments, the simulation error field generated by the FEA analysis is also used as input to the neural network. Machine learning is a process by which computers are given the ability to learn without being explicitly programmed. As opposed to static programming, machine learning uses algorithms trained on some data to make predictions related to that or other data.

According to one embodiment, the neural network utilized at act 160 is a Convolutional Neural Network (CNN). Much like mammalian brains, CNNs apply different levels of detection and recognition to a visualization process. The first layers are used to detect edges, corners, and simple shapes (i.e., filters). Based on these detections, more complex shapes can be recognized. CNNs can provide an advantage over other computer methods due to their ability to learn and optimize filters automatically. The convolutional layers used in CNNs include filters, each of which is a combination of weights that represent a specific feature extractor. Thus, the convolutional layers have trainable parameters whose weights are adjusted during training using backpropagation, i.e., a gradient descent algorithm, to minimize an error function.

According to one embodiment, the neural network utilized at act 160 is a fully convolutional neural network, also referred to as a Fully Convolutional Network (FCN). The FCN is configured to model high level abstractions in data by layers of low-level analytics of that data. The FCN comprises multiple convolutional layers without any fully connected layers and is configured to learn representations and make decisions based on local spatial input. In contrast to FCNs, traditional CNNs have fully connected layers that cannot manage different input sizes.

The FCN is a type of feed-forward artificial neural network built from stacked multiple convolutional layers that receive three-dimensional arrays of values as input. The FCN repeatedly performs convolution on a local area of the SDF generated at act 152. The FCN includes at least one convolutional layer that extracts a feature by performing a convolution process using a plurality of filters. Each layer models a new representation of data, in which neurons act as feature detectors. Recursively, deeper neurons learn to detect new features formed by those detected by the previous layer.

Multiple layers of convolutional filters can be trained using training data. 3D input data is passed through various convolutional layers and subnetworks to generate a feature map, which estimates the probabilities of the 3D input data "matching" the part model, i.e., the predicted error field.

According to at least one embodiment, the FCN does not use pooling, i.e., does not include a pooling layer that ensures local invariance of data by performing a pooling process to group responses together in a particular area. According to some embodiments, the FCN also does not use normalization such as batch normalization that normalizes the 3D input fed to the subnetworks.

Data used to train the FCN can be obtained from training data stored in the training data database 112. In some embodiments, scanning error data (error fields) can be extracted and used as training data, as shown in FIGS. 1A and 1B, which may then be used to train the FCN. The scanning error data is generated from scanning (and measuring) parts, as described above. The training data set is used to train a model (fit the weights of connections between neurons in the FCN), and then the trained model is used to produce the predicted error field. As also indicated in FIGS. 1A and 1B, the FCN training set may optionally be augmented with simulated details (i.e., simulated error data) from the FEA dataset, which increases the robustness of the FCN.

The FCN has a relatively shallow but wide architecture that utilizes subnetworks within the 3D convolutional neural network. The subnetworks perform dimensionality reduction operations on 3D data before the 3D data is subjected to computationally expensive operations. The subnetworks can also convolve the 3D data at multiple scales by subjecting the 3D data to parallel processing by different 3D convolutional layer paths. The FCN transforms the scalar input of the SDF into a lower resolution vector output representing a predicted error field.

Figure 3:
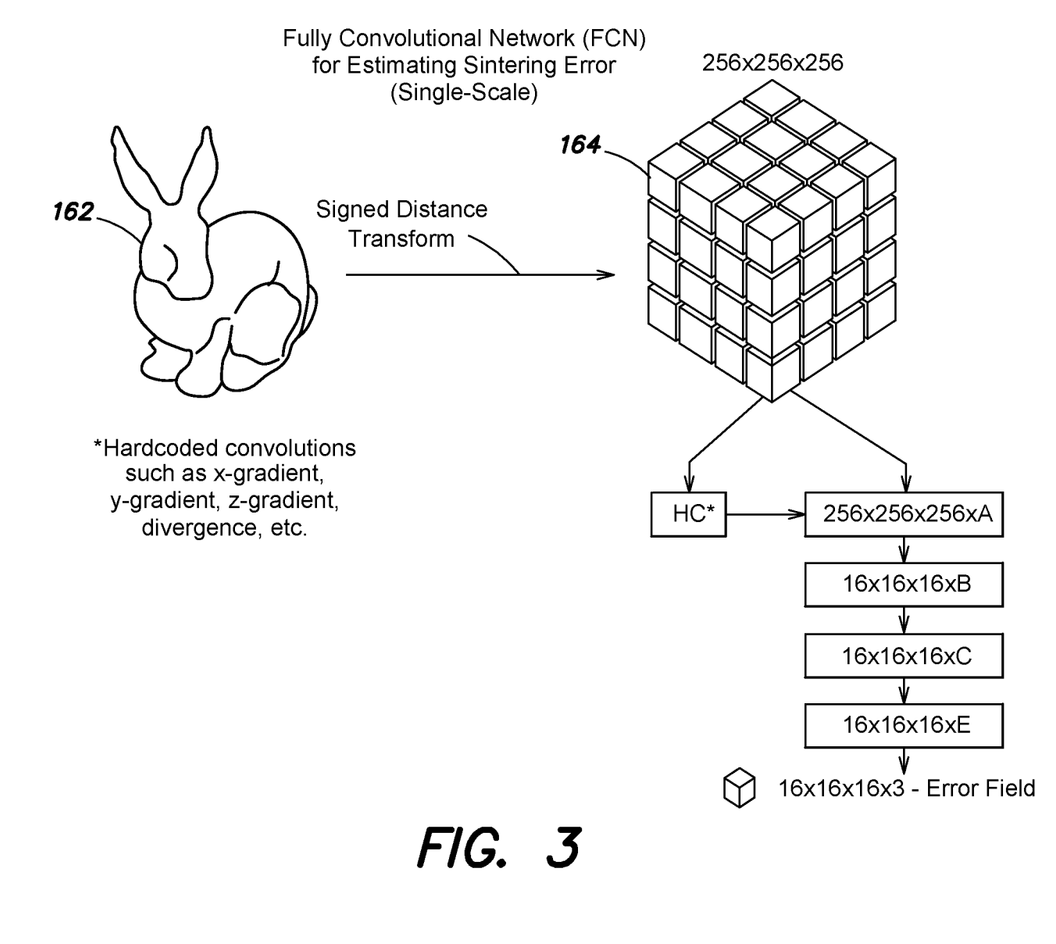
FIG. 3 is a schematic diagram of one example of a neural network architecture according to aspects of the invention.
Figure 4:
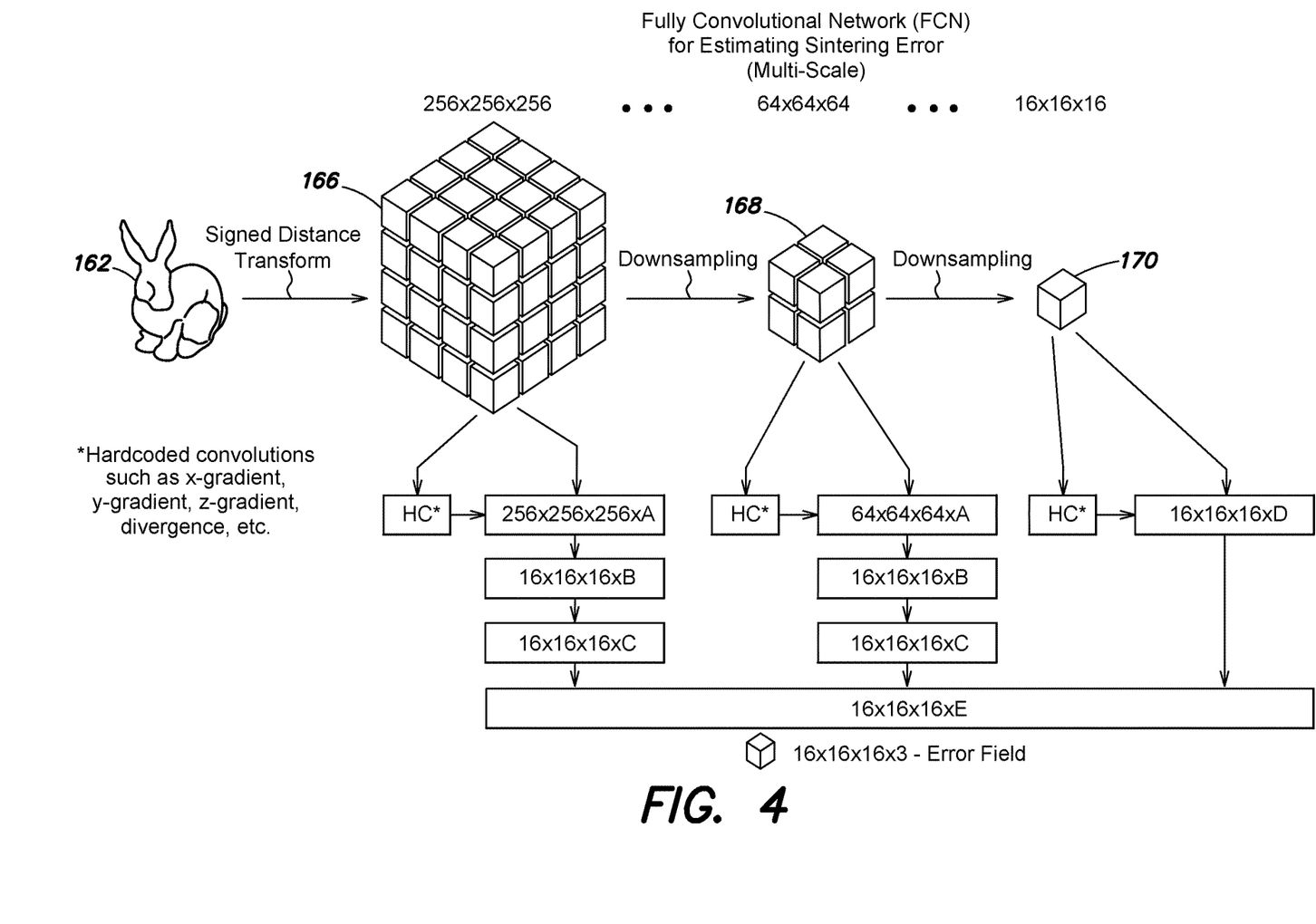
FIG. 4 is a schematic diagram of another example of a neural network architecture according to aspects of the invention.

FIGS. 3 and 4 each provide a 3D view of a digital solid model 162 and exemplify two different FCN architectures that may be used according to various embodiments. FIG. 3 illustrates a single-scale architecture, where the FCN model is designed and trained at one single scale. FIG. 4 illustrates a multi-scale architecture, where the input model 162 is resized to several different scales (for example, three scales) which are fed into the FCN model.

The build space (or volume of the part) of the single-scale architecture shown in FIG. 3 is represented by several planar slices that each include a collection of voxels 164. The dimensions of the voxels are based on the resolution set for the part. The 3D input data has a volume comprised from segmentation cubes, with each segmentation cube having a size corresponding to a voxel grid having a height (h)×width (w)×depth (d). In the example shown in FIG. 3, scale space representation of the part mesh is generated using input mesh data at multiple resolutions. The part mesh is voxelized at an initial resolution (for example, 512×512×512 grid) before the signed distance transform algorithm is applied. As indicated in FIG. 3, successive reduced resolution input meshes, where the next segmentation cube size, i.e., volumetric kernel or convolution filter, is 256×256×256 voxels which is the input volume to the next layer or stage of the process. Successive segmentation cubes decrease the resolution, where each filter in a layer is applied to the output of the previous layer. Thus, as the inputs are processed through different stages, the level of abstraction of the resulting features increases. Shallower layers grasp local information while deeper layers use filters whose receptive fields are much broader and therefore capture global information, i.e., large scale features.

According to at least one embodiment, the neural network is configured as a multi-dimensional network. The example shown in FIG. 3 is configured as a four-dimensional (quaternary) neural network. The network includes multiple layers, where each layer is 3D, and each convolution is 3D (for example, 3×3×3 or 5×5×5 kernel). Each convolutional neural network stage comprises at least one convolutional layer k×k×k×D, where D represents the variable depth of the network stage, as indicated by A, B, C, and E in FIG. 3. The resulting architecture can be characterized as a cascade of multiple layers of nonlinear processing units for feature extraction and transformation where each successive layer uses the output from the previous layer as input.

The build space of the multi-scale architecture shown in FIG. 4 functions by implementing downsampling, which allows for the reduction in the size of the input signal and to increase the receptive field of the features being computed in subsequent network layers. In addition, each of the downsampled SDF stages of the network is used as input to its own subnetwork where the outputs of all the subnetworks are then aggregated together. As shown in FIG. 4, the input part mesh 162 is initially voxelized in a $512^3$ grid, and from this first set a down-sampled distance field is generated to yield a segmentation cube 166 having a size of $256^3$ voxels. The segmentation cube 166 is down-sampled to produce increasingly smaller segmentation including, for example, a second segmentation cube 168 having a size of $64^3$ voxels, and a third segmentation cube 170 having a size of $16^3$ voxels.

Returning to FIG. 1A, at act 163, a predicted error field is generated responsive to execution of act 160. At act 172, a correction field is generated using the predicted error field. At act 174, the correction field is used to generate a corrected mesh. At act 176, the corrected mesh is used to print and sinter a corrected part in a similar manner as described above in reference to the iterative process 104 of FIG. 1C (for example, at act 150).

Figure 5:
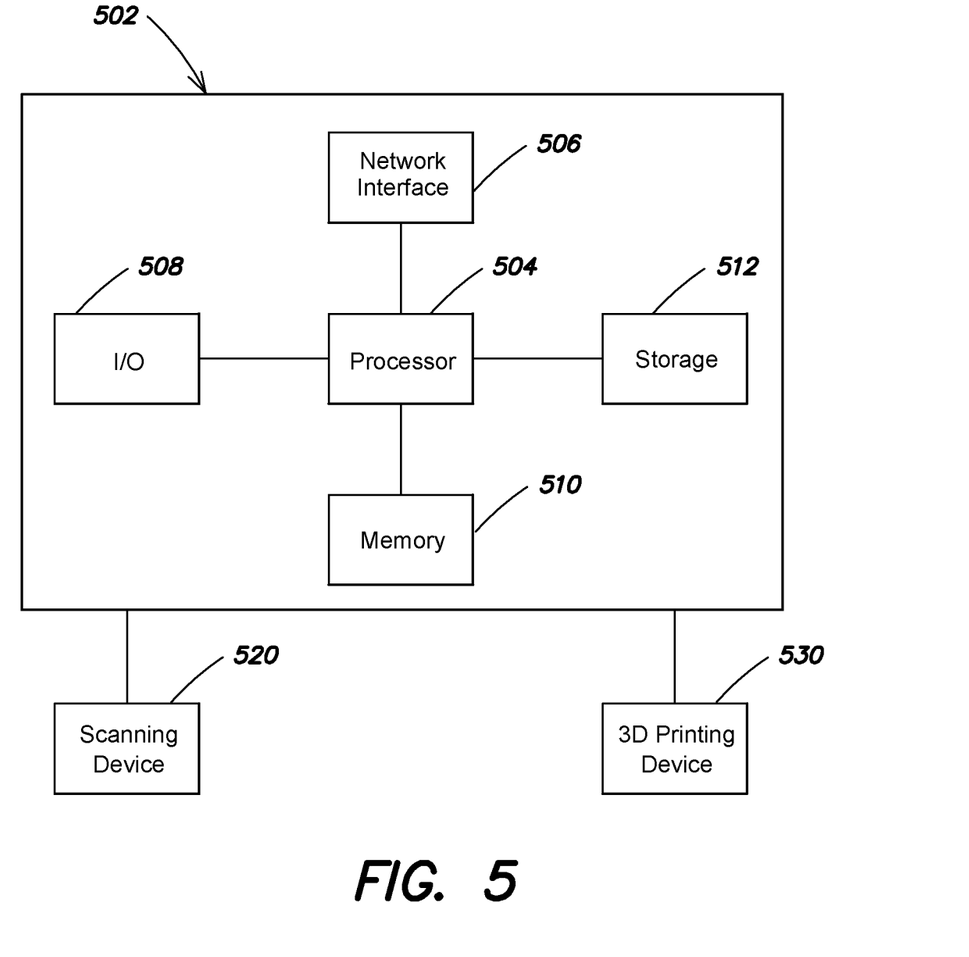
FIG. 5 is a high-level functional block diagram of a computer system that may be used according to aspects of the invention.

Various embodiments may be implemented on one or more computer systems comprising processors, memory units, storage devices, computer software, and other components. A block diagram of a computer system 502 is illustrated in FIG. 5. Computer system 502 contains a processor 504, which controls the operation of the computer system 502 by executing computer program instructions which define such operation. The computer program instructions may be stored in a storage device 512 (for example, magnetic disk) and loaded into memory 510 when execution of the computer program instructions is desired. Thus, the steps of the methods associated with FIGS. 1, 1A, 1B, 1C, and 2-4 may be defined by the computer program instructions stored in the memory 510 and/or storage 512 and controlled by the processor 504 executing the computer program instructions.

A scanning system 520, such as a laser scanning system, can be connected to the computer system 502 to input scan data of a printed part to the computer system 502. According to certain aspects the scanning system 520 and the computer system 502 communicate wirelessly through a network and/or may communicate through hardwire connections. In certain embodiments, the methods described herein may be performed on a single computer or distributed between multiple networked computers.

The computer system 502 also includes one or more network interfaces 506 for communicating with other devices via a network. The computer system 502 also includes other input/output devices 508 that enable user interaction with the computer system 502 (for example, display, keyboard, mouse, speakers, buttons, etc.). Such input/output devices 508 may be used in conjunction with a set of computer programs as an annotation tool to annotate data received from the scanning system 520. One skilled in the art will recognize that an implementation of an actual computer system could contain other components as well, and that FIG. 5 is a high-level representation of some of the components of such a computer for illustrative purposes.

A 3D printing device 530 can also be connected to the computer system 502 which houses 3D printing hardware and printing mechanisms that can be controlled by the computer system 502. The 3D printing device 530 is configured to produce or additively manufacture 3D objects, such as by using additive processes where successive layers or slices are used to be laid down or formed under software control. The computer system 502 and the 3D printing device 530 are coupled to each other via a wireless network and/or through a hardwire connection.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls. Moreover, titles or subtitles may be used in the specification for the convenience of a reader, which shall have no influence on the scope of the present invention.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A method for optimizing a three-dimensional (3D) printing process comprising:
   receiving 3D data characterizing a target 3D part;
   generating a 3D part mesh based on the received 3D data;
   generating a Signed Distance Field (SDF) based on the 3D part mesh;
   performing a predictive analysis using the SDF to generate a predicted error field;
   calculating a correction field based on the predicted error field;
   applying the correction field to the 3D part mesh to produce a corrected 3D part mesh;
   creating a corrected 3D print profile using the corrected 3D part mesh;
   outputting the corrected 3D print profile to a 3D printing device; and
   printing a corrected 3D part using the 3D printing device and the corrected 3D print profile.

2. The method of claim 1, wherein calculating the correction field includes executing a transformation function.

3. The method of claim 1, further comprising executing, with respect to a second 3D part mesh based on second 3D data characterizing a second target 3D part, an iterative process including:
   creating a 3D print profile using the second 3D part mesh;
   outputting the 3D print profile to the 3D printing device;
   printing a 3D part using the 3D printing device and the 3D print profile;
   scanning the 3D part to generate a measured point-set; and
   performing at least one regression analysis on the measured point-set.

4. The method of claim 3, further comprising:
   determining a coarse fit between the second 3D data and the second 3D part mesh;
   determining, based on the coarse fit, a fine fit between the second 3D data and the second 3D part mesh; and
   outputting, based on the coarse fit and the fine fit, an iterative error field.

5. The method of claim 4, wherein determining the coarse fit includes executing a least squares regression analysis on the second 3D data and the second 3D part mesh to generate a seed value.

6. The method of claim 5, wherein determining the fine fit includes executing a patchwise least squares analysis on the seed value.

7. The method of claim 4, wherein the 3D print profile includes a plurality of scan points, wherein generating the iterative error field includes dividing each scan point of the plurality of scan points into a second plurality of scan points, and wherein a third plurality of scan points includes each respective second plurality of scan points.

8. The method of claim 7, further comprising:
   executing a fine fit analysis on the third plurality of scan points; and
   outputting, based on the fine fit analysis, the iterative error field.

9. The method of claim 8, wherein the predictive analysis comprises:
   computing a distance field of the 3D part mesh over a 3D voxel grid to generate a 3D matrix of SDF values; and
   processing the 3D matrix of SDF values using a neural network, wherein the neural network comprises a plurality of subnetworks arranged in a sequence from highest to lowest and processing comprises processing the 3D matrix of SDF values through each of the subnetworks in the sequence, and each subnetwork is configured to receive a preceding output representation generated by a preceding subnetwork in the sequence.

10. The method of claim 9, further comprising:
    training the neural network on a training data set obtained from printed and scanned 3D parts, the training data set including the iterative error field.

11. A non-transitory computer-readable medium storing sequences of computer-executable instructions for optimizing a three-dimensional (3D) printing process, the sequences of computer-executable instructions including instructions that instruct at least one processor to:
    receive 3D data characterizing a target 3D part;
    generate a 3D part mesh based on the received 3D data;
    generate a Signed Distance Field (SDF) based on the 3D part mesh;
    perform a predictive analysis using the SDF to generate a predicted error field;
    calculate a correction field based on the predicted error field;
    apply the correction field to the 3D part mesh to produce a corrected 3D part mesh;
    create a corrected 3D print profile using the corrected 3D part mesh;
    output the corrected 3D print profile to a 3D printing device; and
    print a corrected 3D part using the 3D printing device and the corrected 3D print profile.

12. The computer-readable medium of claim 11, wherein, in instructing the at least one processor to calculate the correction field, the sequences of computer-executable instructions instruct the at least one processor to execute a transformation function.

13. The computer-readable medium of claim 11, wherein the sequences of computer-executable instructions further instruct the at least one processor to execute, with respect to a second 3D part mesh based on second 3D data characterizing a second target 3D part, an iterative process, and wherein, in instructing the at least one processor to perform the iterative process, the sequences of computer-executable instructions instruct the at least one processor to:
  create a 3D print profile using the second 3D part mesh;
  output the 3D print profile to the 3D printing device;
  print a 3D part using the 3D printing device and the 3D print profile;
  scan the 3D part to generate a measured point-set; and
  perform at least one regression analysis on the measured point-set.

14. The computer-readable medium of claim 13, wherein the sequences of computer-executable instructions instruct the at least one processor to:
  determine a coarse fit between the second 3D data and the second 3D part mesh;
  determine, based on the coarse fit, a fine fit between the second 3D data and the second 3D part mesh; and
  output, based on the coarse fit and the fine fit, an iterative error field.

15. The computer-readable medium of claim 14, wherein, in instructing the at least one processor to determine the coarse fit, the sequences of computer-executable instructions instruct the at least one processor to execute a least squares regression analysis on the 3D data and the 3D part mesh to generate a seed value.

16. The computer-readable medium of claim 15, wherein, in instructing the at least one processor to determine the fine fit, the sequences of computer-executable instructions instruct the at least one processor to execute a patchwise least squares analysis on the seed value.

17. The computer-readable medium of claim 14, wherein the 3D print profile includes a plurality of scan points, wherein, in instructing the at least one processor to generate the iterative error field, the sequences of computer-executable instructions instruct the at least one processor to divide each scan point of the plurality of scan points into a second plurality of scan points, and wherein a third plurality of scan points includes each respective second plurality of scan points.

18. The computer-readable medium of claim 17, wherein the sequences of computer-executable instructions further include instructions that instruct at least one processor to:
  execute a fine fit analysis on the third plurality of scan points; and
  output, based on the fine fit analysis, the iterative error field.

19. The computer-readable medium of claim 18, wherein, in instructing the at least one processor to perform the predictive process, the sequences of computer-executable instructions instruct the at least one processor to:
  compute a distance field of the 3D part mesh over a 3D voxel grid to generate a 3D matrix of SDF values; and
  process the 3D matrix of SDF values using a neural network, wherein the neural network comprises a plurality of subnetworks arranged in a sequence from highest to lowest and processing comprises processing the 3D matrix of SDF values through each of the subnetworks in the sequence, and each subnetwork is configured to receive a preceding output representation generated by a preceding subnetwork in the sequence.

20. The computer-readable medium of claim 19, wherein the sequences of computer-executable instructions further include instructions that instruct at least one processor to:
  train the neural network on a training data set obtained from printed and scanned 3D parts, the training data set including the iterative error field.

* * * * *